(12) United States Patent
Bai et al.

(10) Patent No.: US 10,292,308 B2
(45) Date of Patent: May 14, 2019

(54) FLUID COUPLING MATING APPARATUS AND METHOD

(71) Applicant: Futurewei Technologies, Inc., Plano, TX (US)

(72) Inventors: Mo Bai, San Jose, CA (US); Vadim Gektin, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 947 days.

(21) Appl. No.: 14/811,757

(22) Filed: Jul. 28, 2015

(65) Prior Publication Data

US 2017/0030497 A1    Feb. 2, 2017

(51) Int. Cl.
| | |
|---|---|
| *H05K 7/20* | (2006.01) |
| *F16L 37/05* | (2006.01) |
| *F16L 37/56* | (2006.01) |
| *F16L 37/00* | (2006.01) |
| *F16L 37/08* | (2006.01) |
| *F16L 39/00* | (2006.01) |
| *G06F 1/20* | (2006.01) |

(52) U.S. Cl.
CPC ........ *H05K 7/20272* (2013.01); *F16L 37/004* (2013.01); *F16L 37/05* (2013.01); *F16L 37/08* (2013.01); *F16L 37/56* (2013.01); *F16L 39/00* (2013.01); *G06F 1/20* (2013.01)

(58) Field of Classification Search
CPC ....... F16L 37/002; F16L 37/004; F16L 37/02; F16L 37/04; F16L 37/05; F16L 37/08; F16L 37/56; F16L 37/62; F16L 39/00; F16L 2201/40; H05K 7/20272; G06F 1/20

USPC ................. 285/18, 24–29, 124.1–124.5, 920
See application file for complete search history.

(56) References Cited

U.S. PATENT DOCUMENTS

| | | | | |
|---|---|---|---|---|
| 3,680,893 A | * | 8/1972 | Giraud | F16L 37/16 285/316 |
| 7,757,366 B2 | * | 7/2010 | Vorley | B25B 27/10 285/18 |
| 8,075,022 B2 | * | 12/2011 | Blassmann | F15B 13/0814 285/124.4 |
| 8,767,391 B2 | | 7/2014 | Jin et al. | |
| 8,864,179 B2 | * | 10/2014 | Kitagawa | F16L 37/32 285/124.3 |
| 8,884,425 B1 | | 11/2014 | Mohammed et al. | |
| 2010/0136501 A1 | * | 6/2010 | Schuetz | A61C 8/0022 433/80 |
| 2013/0192800 A1 | * | 8/2013 | Tiberghien | F28F 27/00 165/108 |
| 2014/0262449 A1 | | 9/2014 | Gektin et al. | |
| 2015/0036280 A1 | | 2/2015 | Gektin et al. | |
| 2016/0010772 A1 | * | 1/2016 | Tiberghien | B23P 15/26 165/177 |

\* cited by examiner

*Primary Examiner* — James M Hewitt, II
(74) *Attorney, Agent, or Firm* — Conley Rose, P.C.

(57) ABSTRACT

A fluid coupling mating apparatus and method. Included is at least one mating member for removably coupling with another mating member for allowing fluid to pass therebetween. A lock is movably coupled to the at least one mating member. Still yet, a holder is coupled to the lock for holding the lock in relation to the holder during at least a portion of the removable coupling of the at least one mating member with another mating member.

20 Claims, 9 Drawing Sheets

FLUID COUPLING MATING APPARATUS AND METHOD

FIELD OF THE INVENTION

The present invention relates to couplings to permit fluid flow, and more particularly to fluid coupling mating techniques.

BACKGROUND

Due to limitations (e.g. airflow, noise level, etc.) of air cooling, use of liquid cooling is drawing an increasing interest from the information and communication technologies industry. One of the challenges of liquid cooling applications is its common use of quick-(dis)connects (QDs) that require manual manipulation for disconnecting fluid couplings.

Prior art FIG. 1 is a perspective view of a router 100 that includes a liquid cooling system 102 adapted for removably coupling with line cards 104 for cooling purposes, in accordance with the prior art. In use, the line cards 104 are equipped for being removably positioned within the router 100 and thereby removably coupled to the liquid cooling system 102. To facilitate such removable coupling, a manual fluid coupling assembly 106 is provided for allowing a user, with one or more manual manipulations, to removably couple fluid connectors between the line cards 104 and the liquid cooling system 102.

Prior art FIG. 2 is a side view of the manual fluid coupling assembly 106 that is designed for removably coupling the line cards 104 with the liquid cooling system 102 for cooling purposes, in accordance with the prior art. During such removable coupling, a user is required to manipulate the lever 202, as well as a lock 204 to effect (de-)coupling.

Thus, the state-of-the-art of QD design involves complicated moving of mechanical components, and additional manual steps when compared with air-cooled printed circuit boards (PCBs). Such additional moving mechanical components, in turn, make liquid cooling system design, using QDs, more expensive and more prone to mechanical failures and malfunctions, as compared to air-cooled designs. Further, the additional manual steps require more training and operation time, thus increasing maintenance costs.

There is thus a need for addressing these and/or other issues associated with the prior art.

SUMMARY

A fluid coupling mating apparatus and method are provided. Included is at least one mating member for removably coupling with another mating member for allowing fluid to pass therebetween. A lock is movably coupled to the at least one mating member. Still yet, a holder is coupled to the lock for holding the lock in relation to the holder during at least a portion of the removable coupling of the at least one mating member with another mating member.

BRIEF DESCRIPTION OF THE DRAWINGS

Prior art

Prior art

DETAILED DESCRIPTION

Figure 3:
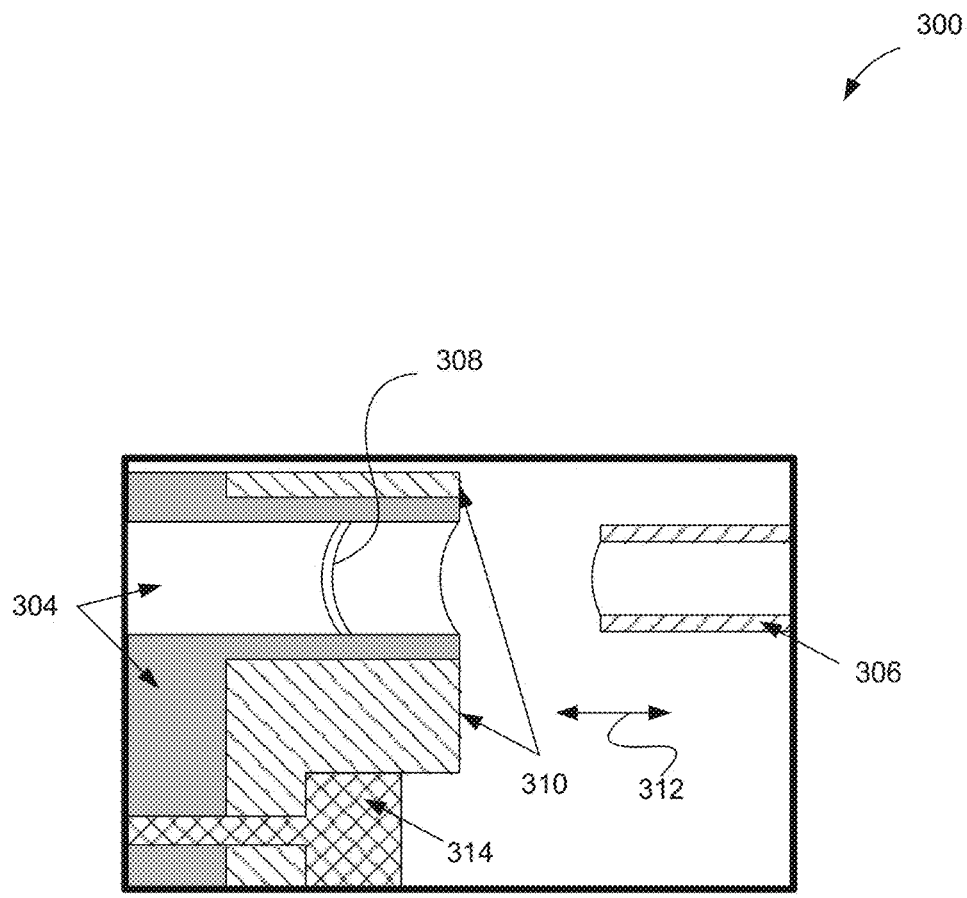
FIG. 3 is a side cross-sectional view of a fluid coupling mating apparatus, in accordance with one embodiment.

FIG. 3 is a side cross-sectional view of a fluid coupling mating apparatus 300, in accordance with one embodiment. As shown, at least one mating member 304 is provided for removably coupling with another mating member 306 for allowing fluid to pass therebetween. As shown, the at least one mating member 304 includes a socket and the another mating member 306 includes a plug. In other embodiments, the at least one mating member 304 may include a plug and the another mating member 306 may include a socket.

As further shown, the mating members 304, 306 may, in one embodiment, be sized and shaped for providing a frictional coupling therebetween, for facilitating secured removable coupling between the mating members 304, 306. Still yet, the mating members 304, 306 may include an annular detent/protrusion 308 for facilitating secured removable coupling between the mating members 304, 306. With that said, the mating members 304, 306 may, in still other embodiments, include other types of mating members that do not necessarily include a plug/socket combination, and further rely on other types of coupling mechanisms (e.g. seals, etc.), insofar as the mating members 304, 306 provide hermetically sealed fluid flow therebetween, when coupled.

With continued reference to FIG. 3, a lock 310 is shown to be movably coupled to the at least one mating member 304. In the embodiment shown in FIG. 3, the lock 310 at least partially encompasses the at least one mating member 304. By virtue of such design, the lock 310 is slidably coupled 312 to the at least one mating member 304.

As will be shown in the context of different embodiments shown in subsequent figures, the at least one mating member 304 and the lock 310 may also be movably coupled to a housing component (not shown in FIG. 3). Specifically, the at least one mating member 304 and the lock 310 may be movably coupled to the housing component such that the at least one mating member 304 and the lock 310 are each independently moveable along a single axis.

Further included is a holder 314 coupled to the lock 310 for holding the lock 310 in relation to the holder 314 during at least a portion of the removable coupling of the at least one mating member 304 with the another mating member 306. Specifically, during coupling, coupling, the holder 314 may be operable for holding the lock 310 in relation to the holder 314 until the at least one mating member 304 is completely coupled with the another mating member 306, for locking purposes. Conversely, during de-coupling, the holder 314 may be further operable for applying pressure on the lock 310 to unlock the another mating member 306 from the at least one mating member 304, thereby allowing the complete removal of the another mating member 306 from the at least one mating member 304.

Figure 1:
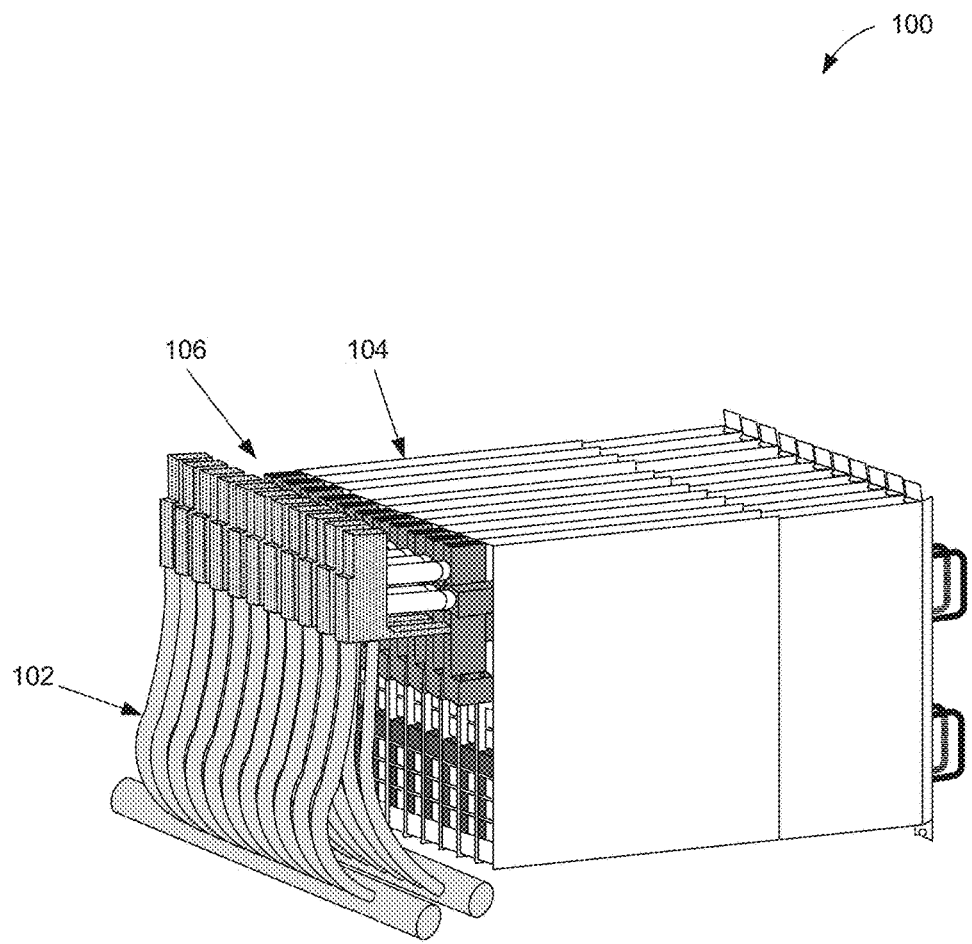
FIG. 1 is a perspective view of a router that includes a liquid cooling system adapted for removably coupling with line cards for cooling purposes, in accordance with the prior art.
Figure 2:
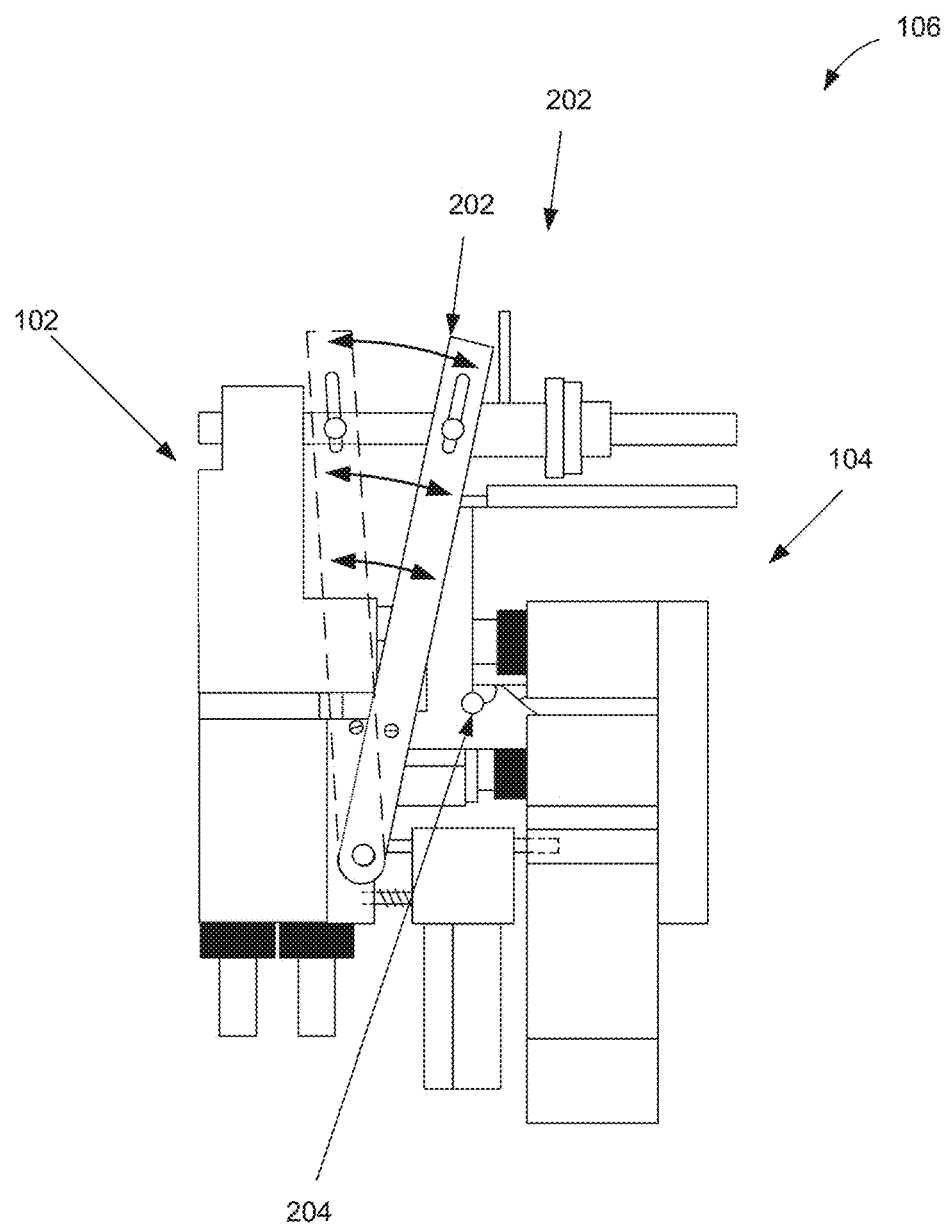
FIG. 2 is a side view of a manual fluid coupling assembly that is designed for removably coupling line cards with a liquid cooling system for cooling purposes, in accordance with the prior art.

While the holder may afford the aforementioned functionality in any desired manner, the holder 314 may include a magnet, in one embodiment. More information regarding such embodiment will be set forth during the description of different embodiments shown in subsequent figures. It should be noted that the fluid coupling mating apparatus 300 may be implemented in the context of any desired environment that requires a flow of fluid between components. Just by way of example, the apparatus 300 may be configured for utilizing the fluid for cooling any desired components (e.g. circuit board, heat sinks, motors, etc.) of any desired system (e.g. server, storage system, mechanical system, etc.). For instance, in one embodiment, the components being cooled may be positioned on at least one of a plurality of line cards removably positioned in a network router housing (like that shown in Prior Art FIGS. 1-2.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 4:
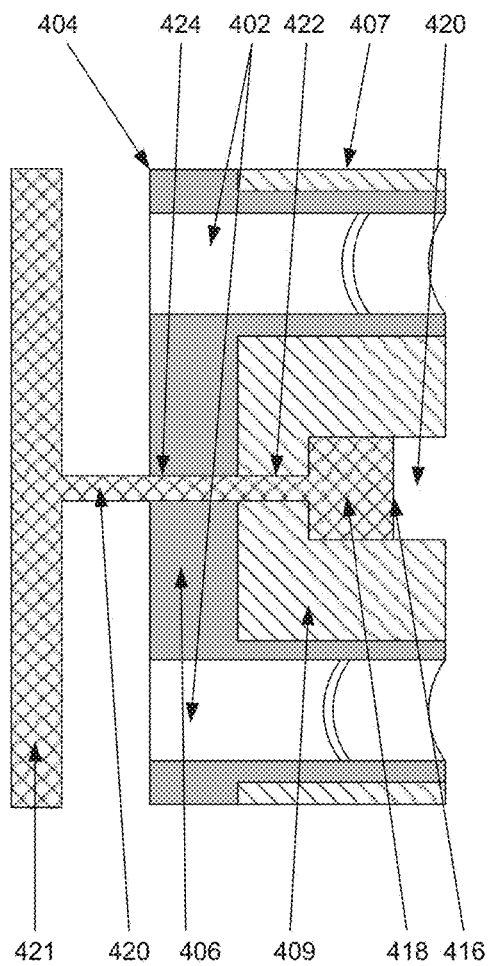
FIG. 4 is a side cross-sectional view of a fluid coupling mating apparatus, in accordance with another embodiment.

FIG. 4 is a side cross-sectional view of a fluid coupling mating apparatus 400, in accordance with another embodiment. As an option, the apparatus 400 may be implemented in the context of the details of FIG. 3. Of course, however, the apparatus 400 may be implemented in the context of any desired environment.

As shown in FIG. 4, the apparatus 400 is similar to the embodiment of FIG. 3, except that the aforementioned at least one mating member (e.g. mating member 304 of FIG. 3, etc.) includes a pair of parallel-situated sockets 402 that are part of a socket assembly 404 with a socket assembly intermediate portion 406. As shown, the socket assembly 404 including the sockets 402 are both movably coupled to a lock 407 that includes a lock intermediate portion 409. The manner in which the socket assembly 404 and the sockets 402 are movably coupled to the lock 407 during use will be described later in greater detail.

Analogous to the socket assembly 404, the at least one other mating member (e.g. mating member 306 of FIG. 3, etc.) includes a pair of parallel-situated plugs 408 that are part of a plug assembly 410 with a plug assembly intermediate portion 412. As will soon become apparent, the plug assembly 410 including the plugs 408 are removably coupled to the respective parallel-situated sockets 402 of the socket assembly 404. As further shown in FIG. 4, a printed circuit board (PCB) 414 is fixedly coupled to the plug assembly 410.

With continued reference to FIG. 4, a holder assembly 416 is provided including a holder 418 that is slidably coupled within a cavity 420 formed in the lock intermediate portion 409. In one embodiment, the holder 418 may include a magnet. The holder assembly 416 further includes a rod 420 with a first end coupled to the holder 418 and a second end coupled to a stationary housing 421. Such rod 420 is slidably inserted in a first aperture 422 formed in the lock intermediate portion 409 and a second aperture 424 formed in the socket assembly intermediate portion 406.

Figure 5:
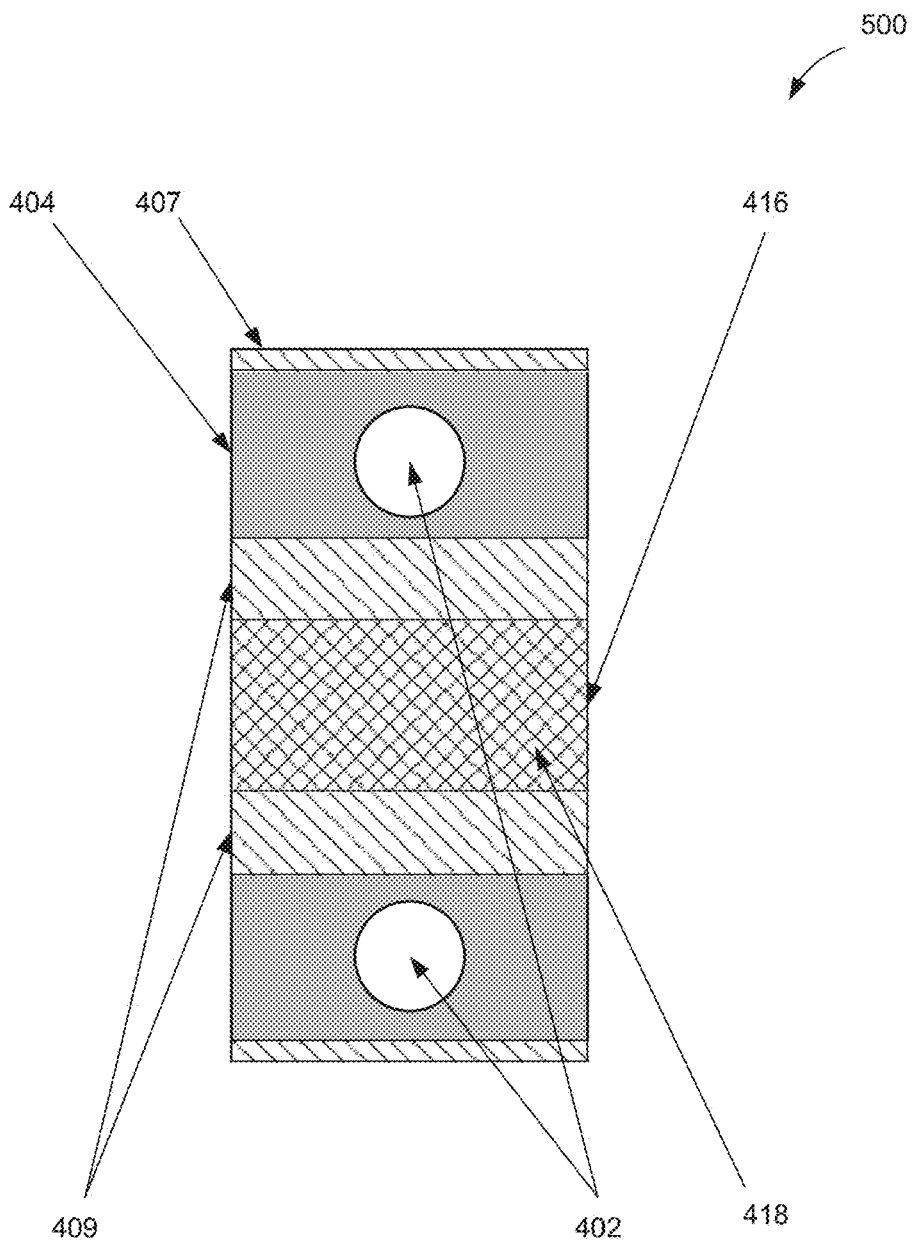
FIG. 5 is a front view of the socket assembly, the lock, and the holder assembly of the fluid coupling mating apparatus of FIG. 4 taken along line 5-5 of FIG. 4, in accordance with one embodiment.

FIG. 5 is a front view of the socket assembly 404, the lock 407, and the holder assembly 416 of the fluid coupling mating apparatus 400 of FIG. 4 taken along line 5-5 of FIG. 4, in accordance with one embodiment. As shown, the socket assembly 404 and the sockets 402 are encompassed by the lock 407. Similarly, the lock intermediate portion 409 encompasses the holder 418 of the holder assembly 416. To this end, the foregoing components may slide with respect to each other, in the manner set forth in FIG. 4, without undue "play."

Figure 6:
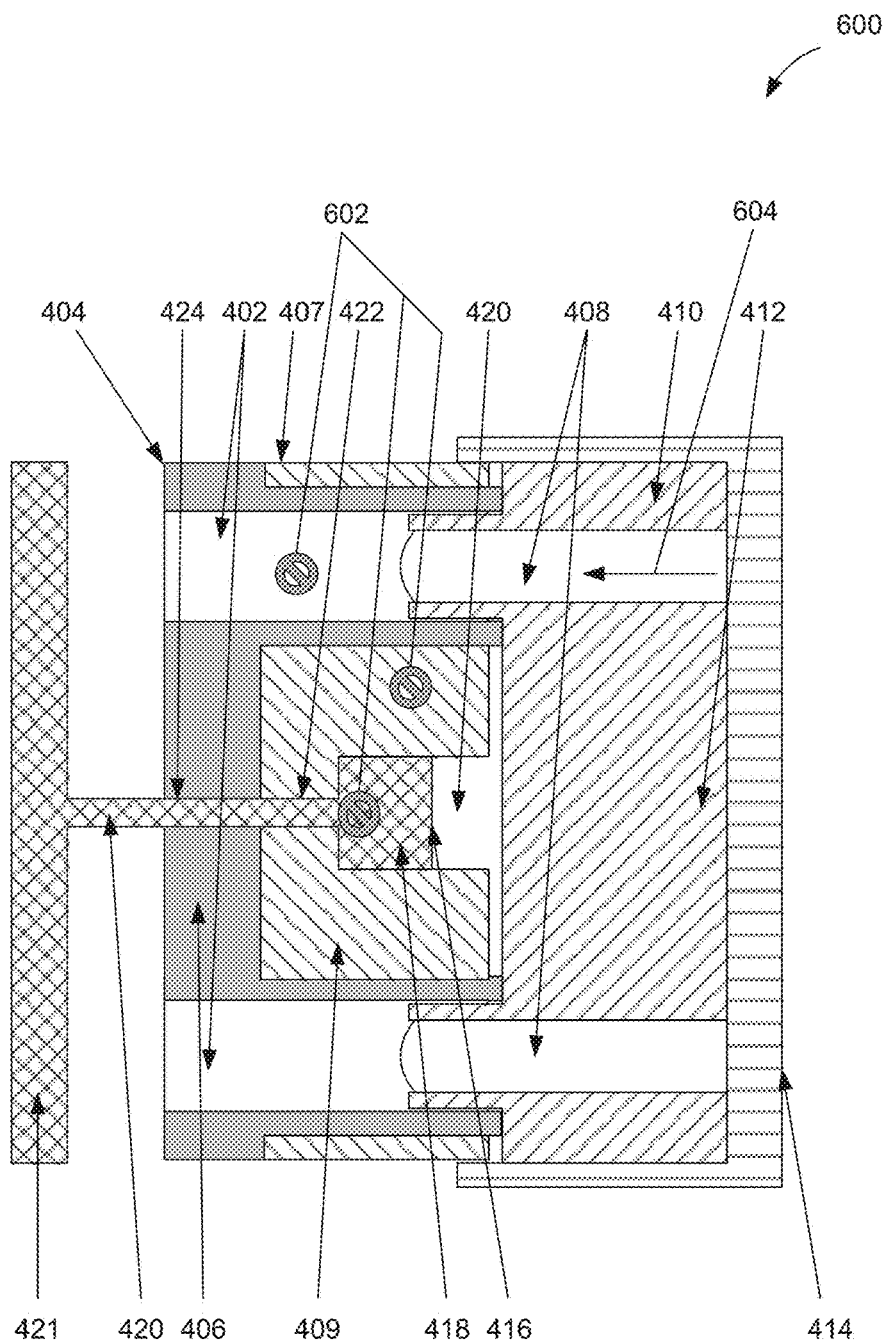
FIG. 6 is the same side cross-sectional view of the fluid coupling mating apparatus as illustrated in FIG. 4, but showing a first stage of removable coupling of the socket assembly and the plug assembly, in accordance with one embodiment.
Figure 7:
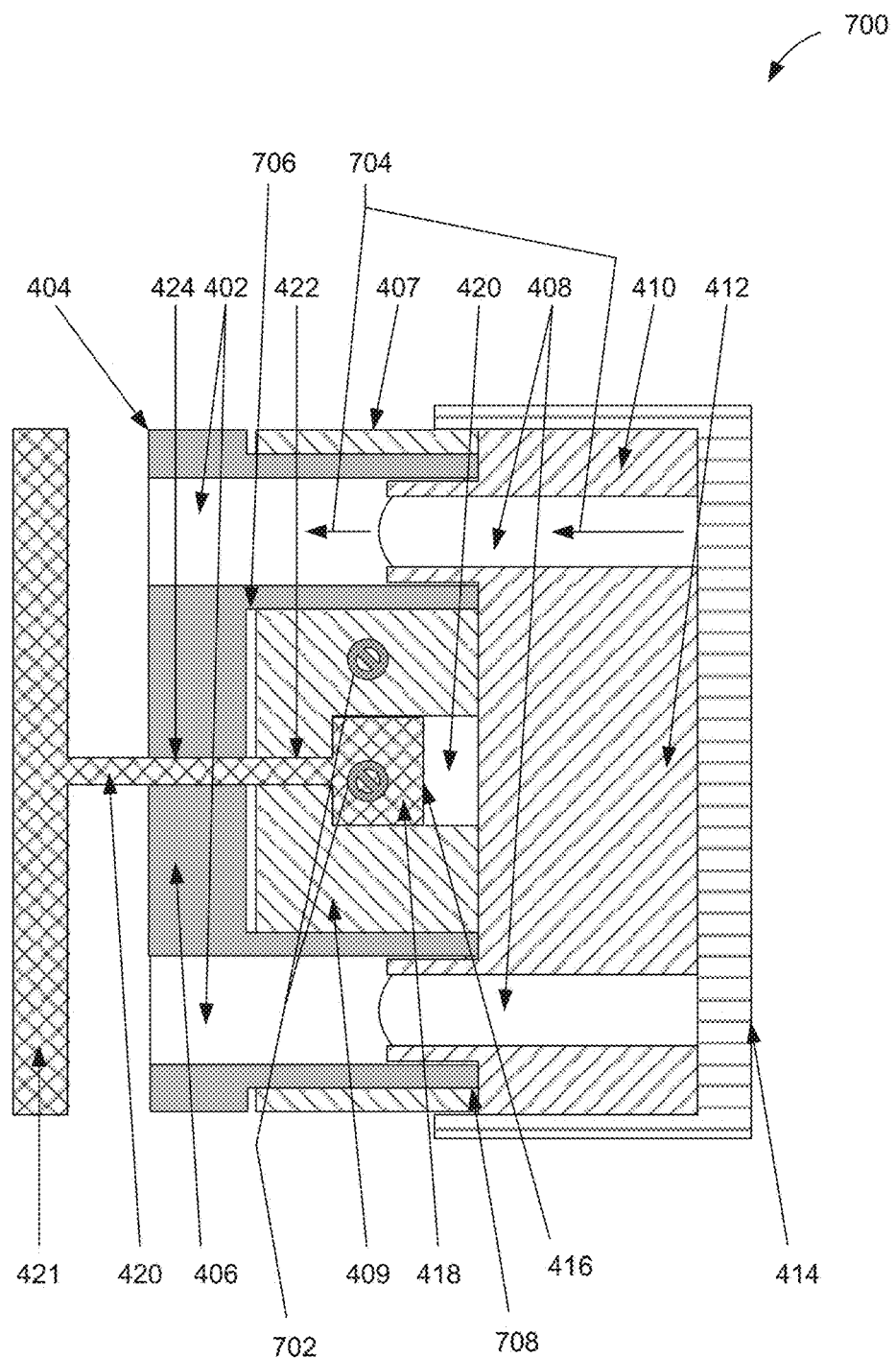
FIG. 7 is the same side cross-sectional view of the fluid coupling mating apparatus as illustrated in FIG. 4, but showing a second stage of removable coupling of the socket assembly and the plug assembly, in accordance with one embodiment.
Figure 8:
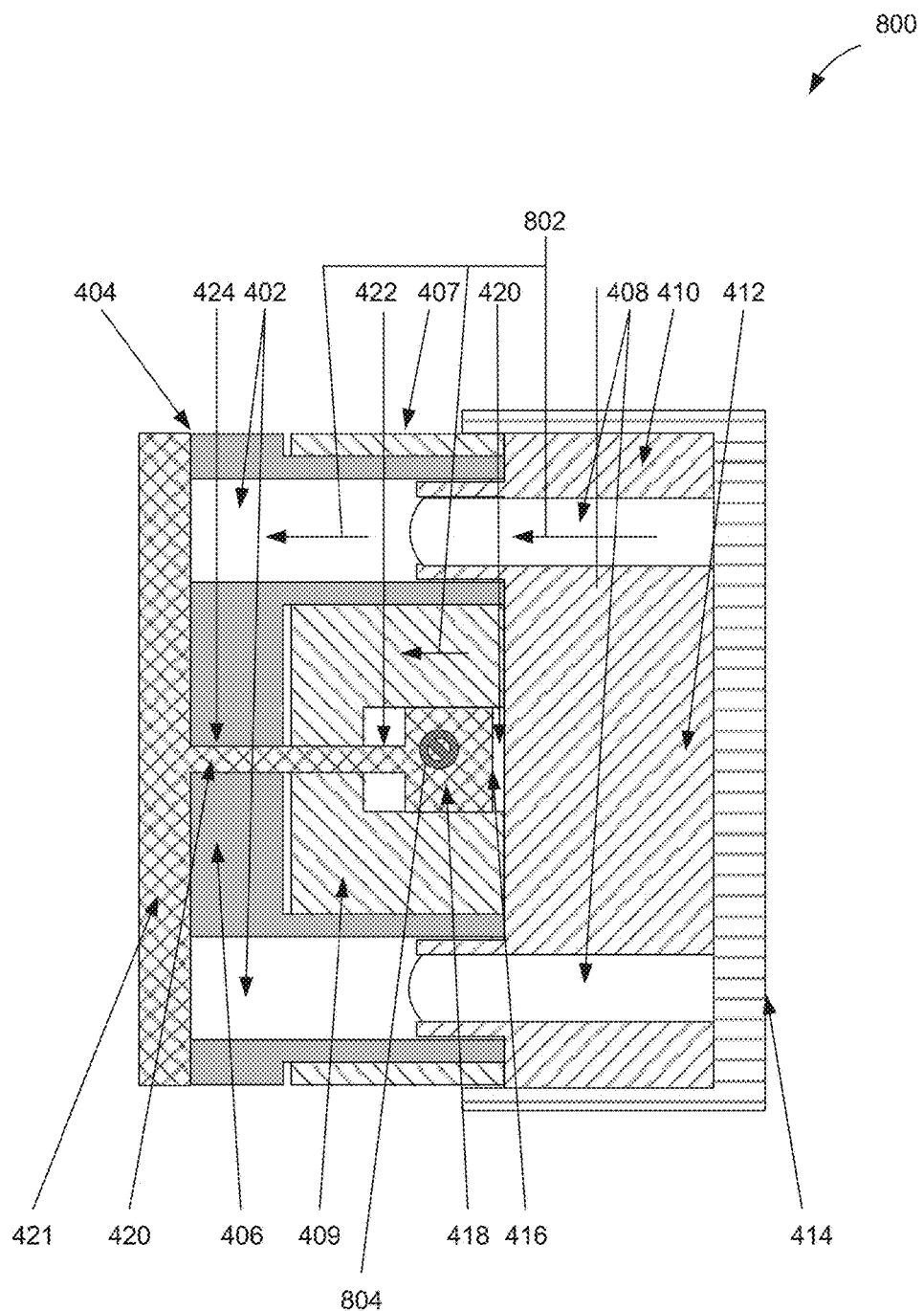
FIG. 8 is the same side cross-sectional view of the fluid coupling mating apparatus as illustrated in FIG. 4, but showing a final stage of removable coupling of the socket assembly and the plug assembly, in accordance with one embodiment.

FIGS. 6-8 are the same side cross-sectional view of the fluid coupling mating apparatus 400 as illustrated in FIG. 4, but showing various stages of the removable coupling of the socket assembly 404 and the plug assembly 410 which, in turn, illustrate the operation of the lock 407 and the holder assembly 416, in accordance with one embodiment.

For example, FIG. 6 is the same side cross-sectional view of the fluid coupling mating apparatus 400 as illustrated in FIG. 4, but showing a first stage 600 of removable coupling of the socket assembly 404 and the plug assembly 410, in accordance with one embodiment. As shown, during the first stage 600 of removable coupling, the pair of parallel-situated plugs 408 of the plug assembly 410 are completely inserted into the parallel-situated sockets 402 of the socket assembly 404.

The aforementioned insertion is effected by the socket assembly 404, the lock 407, and the holder assembly 416 remaining stationary 602 with respect to the stationary housing 421. While the foregoing components remain stationary 602, the parallel-situated plugs 408 of the plug assembly 410 are completely inserted into the parallel-situated sockets 402 of the socket assembly 404 by way of movement 604. Such movement 604 may be effected by a user manually inserting the PCB 414 (to which the plug assembly 410 is attached) into the stationary housing 421.

In use, the complete engagement may be manifested by the full frictional engagement and/or engagement of a complimentary annular detent/protrusion arrangement. Further, the lock 407 may be held in place during such engagement by virtue of the holder 418 of the holder assembly 416 being magnetically coupled to the lock intermediate portion 409 of the lock 407.

FIG. 7 is the same side cross-sectional view of the fluid coupling mating apparatus 400 as illustrated in FIG. 4, but showing a second stage 700 of removable coupling of the socket assembly 404 and the plug assembly 410, in accordance with one embodiment. As shown, during the second stage 700 of removable coupling, the parallel-situated plugs 408 of the plug assembly 410 remain completely inserted into, and engaged with, the parallel-situated sockets 402 of the socket assembly 404.

At this point, the plug assembly 410 and the socket assembly 404 move 704 together, while the lock 407 and holder assembly 416 remain stationary 706. As mentioned earlier, the movement 704 of the parallel-situated plugs 408 of the plug assembly 410 continues by virtue of the user continuing to insert the PCB 414 (to which the plug assembly 410 is attached) into the stationary housing 421, and exerting continued force on the PCB 414. Such movement 704 continues until the plug assembly intermediate portion 412 abuts the lock 407, as shown, and a spacing 706 emerges between the lock 407 and the socket assembly intermediate portion 406, as the socket assembly 404 moves independently of the stationary lock 407.

It is at this second stage 700 that the lock 407 engages a locking mechanism 708 therebeneath (e.g. on an outer surface of the socket assembly 404) for locking the plug assembly 410 and the socket assembly 404, during use. In various embodiments, such locking mechanism 708 may include a detent, beveled edge, and/or seal on an outer surface of the socket assembly 404 that a complimentary surface or structure on an inner surface of the lock 407 frictionally couples, abuts, and/or otherwise engages, for locking purposes. In other embodiments, the lock 407 may engage the locking mechanism 708 to bind the socket assembly 404 such that an inner surface of the sockets 402 is pressed against an outer surface of the plugs 408 of the plug assembly 410, for locking purposes. In still other embodiments, the lock 407 may engage a spring-biased pin or other structure of the locking mechanism 708 that passes through the wall of the sockets 402 of the socket assembly 404 and engages a complementary divot or other structure formed on an outer surface of the plugs 408 of the plug assembly 410, again, for locking purposes.

FIG. 8 is the same side cross-sectional view of the fluid coupling mating apparatus 400 as illustrated in FIG. 4, but showing a final stage 800 of removable coupling of the socket assembly 404 and the plug assembly 410, in accordance with one embodiment. As shown, during the final stage 800 of removable coupling, the parallel-situated plugs 408 of the plug assembly 410 remain completely inserted into, and engaged with, with, the parallel-situated sockets 402 of the socket assembly 404. Movement 802 continues under the aforementioned force being exerted by the insertion of the PCB 414. In one optional embodiment, such force may break a magnetic coupling between the lock 407 and the holder assembly 416. In any case, the lock 407 moves with the plug assembly 410 and the socket assembly 404. This movement 802 continues, while the holder assembly 416 remains stationary 804, until the socket assembly 404 abuts the housing 421, as shown.

Of course, while a locking sequence has been shown in the sequence of FIGS. 6-8, it should be noted that an unlocking sequence is now readily apparent. Specifically, such unlocking sequence may be initiated by reversing the sequential motion that is shown in FIG. 6-8.

Figure 9:
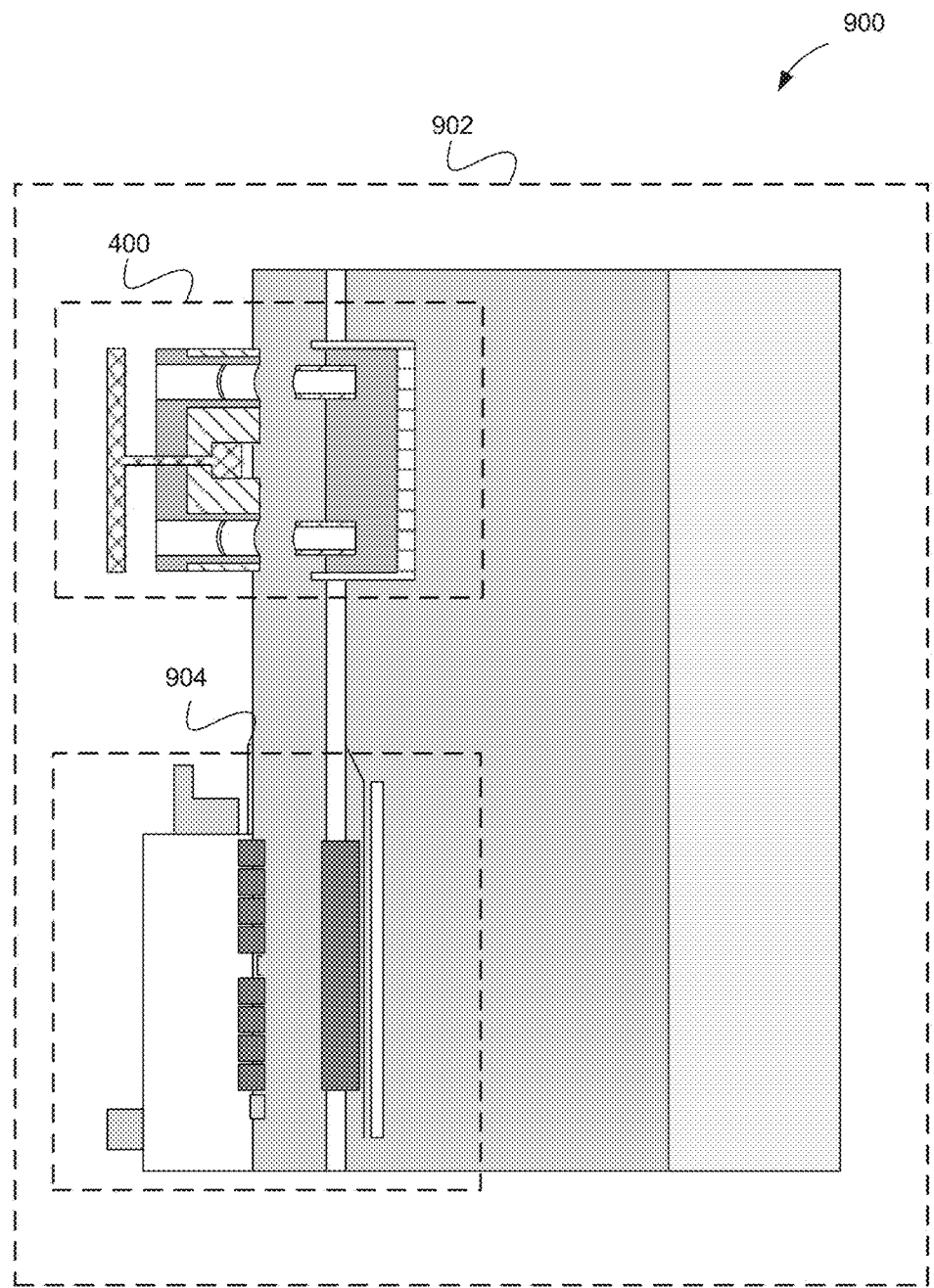
FIG. 9 is an environmental view of the fluid coupling mating apparatus as illustrated in FIG. 4, in an exemplary router line card environment, in accordance with one embodiment.

FIG. 9 is an environmental view of the fluid coupling mating apparatus 400 as illustrated in FIG. 4, in an exemplary router line card environment 900, in accordance with one embodiment. As shown, the coupling mating apparatus 400 is a component of the PCB of a line card that is removably coupled in a router housing 902. As shown, the PCB of the line card and corresponding portion of the router housing 902 further include electrical connectors 904 for electrically connecting the PCB of the line card with complimentary electrical connectors of the router housing 902.

In use, the fluid coupling mating apparatus 400 is configured for allowing the fluid coupling mating apparatus 400 to engage and permit fluid coupling, before any electrical coupling via the electrical connectors 904, for safety reasons. In some embodiments, the requirement for fluid coupling before any electrical coupling may even be guaranteed for increased safety. Similarly, while disassembling line cards, the fluid coupling mating apparatus 400 may allow electrical connections to be decoupled first, after which the fluid couplings may be decoupled. In various embodiments, this sequential de-coupling may also be required for increased safety, as mentioned earlier.

Further, by virtue of the quick-connect nature of the fluid coupling mating apparatus 400, fluid coupling does not necessarily require a user to extend their hand behind the router housing 902 to manually manipulate the fluid coupling mating apparatus 400 for the purpose of coupling and de-coupling the fluid mating members when a line card is required for installment or disassembling. Of course, in some embodiments, manual intervention of some kind is contemplated. In other words, the presence of manual intervention requirements in a design does not necessarily constitute evidence of a lack of use of one or more embodiments disclosed herein, etc.

In addition to reducing the required human intervention and the number and/or complexity of mechanical components, mechanical failures or malfunctions may potentially be avoided in some embodiments, thereby increasing reliability. For example, the need for cranks and/or rods may be avoided, in some possible embodiments. Still yet, by virtue of a possible reduction in required human intervention, required training may be reduced, as well. Possible ancillary features may further involve allowing the housing 902 (and other accompanying housings, etc.) to be more compactly stored in hard/impossible to reach areas.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
    at least one mating member for removably coupling with another mating member for allowing fluid to pass therebetween;
    a lock movably coupled to the at least one mating member; and
    a holder coupled to the lock for holding the lock in relation to the holder during at least a portion of the removable coupling of the at least one mating member with the another mating member;
    wherein the at least one mating member includes a pair of parallel-situated mating members that are both movably coupled to the lock, the lock including a lock intermediate portion;
    wherein the pair of parallel-situated mating members are part of an assembly with a socket assembly intermediate portion;
    wherein the holder is slidably coupled to the lock intermediate portion;
    wherein the holder is slidably coupled within a cavity formed in the lock intermediate portion; and
    further comprising a rod with a first end coupled to the holder and a second end coupled to a housing, the rod slidably inserted in a first aperture formed in the lock intermediate portion and a second aperture formed in the socket assembly intermediate portion.

2. The apparatus of claim 1, wherein the at least one mating member includes a socket and the another mating member includes a plug.

3. The apparatus of claim 1, wherein the at least one mating member is configured for frictionally coupling with the another mating member.

4. The apparatus of claim 1, wherein the lock at least partially encompasses the at least one mating member.

5. The apparatus of claim 4, wherein the lock at least partially encompasses the at least one mating member, such that the movable coupling between the at least one mating member and the lock includes a slidable coupling.

6. The apparatus of claim 1, wherein the at least one mating member and the lock are movably coupled to a housing component.

7. The apparatus of claim 1, wherein the at least one mating member and the lock are movably coupled to a housing component such that the at least one mating member and the lock are each independently moveable along a single axis.

8. The apparatus of claim 1, wherein the holder is operable, during coupling, for holding the lock in relation to the holder until the at least one mating member is completely coupled with the another mating member.

9. The apparatus of claim 1, wherein the holder is operable, during de-coupling, for applying pressure on the lock to unlock the another mating member from the at least one mating member.

10. The apparatus of claim 1, wherein the holder includes a magnet.

11. The apparatus of claim 1, wherein the apparatus is configured for utilizing the fluid for cooling at least one of a plurality of cards removably positioned in a housing.

12. The apparatus of claim 11, wherein the cards include line cards of a network router.

13. A system, comprising:
a housing including:
at least one mating member,
a lock movably coupled to the at least one mating member, and
a holder coupled to the lock for holding the lock in relation to the holder during at least a portion of a removable coupling of the at least one mating member with another mating member of one of a plurality of cards removably insertable into the housing;
wherein the at least one mating member includes a pair of parallel-situated mating members that are both movably coupled to the lock, the lock including a lock intermediate portion;
wherein the pair of parallel-situated mating members are part of an assembly with a socket assembly intermediate portion;
wherein the holder is slidably coupled to the lock intermediate portion;
wherein the holder is slidably coupled within a cavity formed in the lock intermediate portion; and
further comprising a rod with a first end coupled to the holder and a second end coupled to a housing, the rod slidably inserted in a first aperture formed in the lock intermediate portion and a second aperture formed in the socket assembly intermediate portion.

14. The system of claim 13, wherein the at least one mating member includes a socket and the another mating member includes a plug.

15. The system of claim 13, wherein the at least one mating member is configured for frictionally coupling with the another mating member.

16. The system of claim 13, wherein the lock at least partially encompasses the at least one mating member.

17. The system of claim 16, wherein the lock at least partially encompasses the at least one mating member, such that the movable coupling between the at least one mating member and the lock includes a slidable coupling.

18. The system of claim 13, wherein the holder is operable, during coupling, for holding the lock in relation to the holder until the at least one mating member is completely coupled with the another mating member.

19. The system of claim 13, wherein the holder is operable, during de-coupling, for applying pressure on the lock to unlock the another mating member from the at least one mating member.

20. The system of claim 13, wherein the holder includes a magnet.

* * * * *

UNITED STATES PATENT AND TRADEMARK OFFICE
CERTIFICATE OF CORRECTION

PATENT NO. : 10,292,308 B2
APPLICATION NO. : 14/811757
DATED : May 14, 2019
INVENTOR(S) : Mo Bai et al.

It is certified that error appears in the above-identified patent and that said Letters Patent is hereby corrected as shown below:

On the Title Page

(57) Abstract, should read:
A fluid coupling mating apparatus and method are provided. Included is at least one mating member for removably coupling with another mating member for allowing fluid to pass therebetween. A lock is movably coupled to the at least one mating member. Still yet, a holder is coupled to the lock for holding the lock in relation to the holder during at least a portion of the removable coupling of the at least one mating member with another mating member.

In the Claims

Column 6, Claim 1, Lines 34-59, should read:
1. An apparatus, comprising:
    at least one mating member for removably coupling with another mating member for allowing fluid to pass therebetween, the at least one mating member including a pair of parallel-situated mating members that are both movably coupled to the lock, the pair of parallel-situated mating members part of an assembly with a socket assembly intermediate portion, the lock including a lock intermediate portion;
    a lock movably coupled to the at least one mating member;
    a holder coupled to the lock for holding the lock in relation to the holder during at least a portion of the removable coupling of the at least one mating member with the another mating member, the holder is slidably coupled to the lock intermediate portion, and the holder is slidably coupled within a cavity formed in the lock intermediate portion; and
    a rod with a first end coupled to the holder and a second end coupled to a housing, the rod slidably insertable in a first aperture formed in the lock intermediate portion and a second aperture formed in the socket assembly intermediate portion.

Column 7, Claim 13, Lines 29-38, through Column 8, Lines 1-15, should read:
13. A system, comprising:
    a housing including:

Signed and Sealed this
Second Day of July, 2019

Andrei Iancu
*Director of the United States Patent and Trademark Office* at least one mating member, the at least one mating member including a pair of parallel-situated mating members that are both movably coupled to the lock, the pair of parallel-situated mating members part of an assembly with a socket assembly intermediate portion, the lock including a lock intermediate portion;

a lock movably coupled to the at least one mating member, a holder coupled to the lock for holding the lock in relation to the holder during at least a portion of a removable coupling of the at least one mating member with another mating member of one of a plurality of cards removably insertable into the housing, the holder is slidably coupled to the lock intermediate portion, and the holder is slidably coupled within a cavity formed in the lock intermediate portion; and a rod with a first end coupled to the holder and a second end coupled to a housing, the rod slidably insertable in a first aperture formed in the lock intermediate portion and a second aperture formed in the socket assembly intermediate portion.